(12) United States Patent
Gao et al.

(10) Patent No.: US 12,148,774 B2
(45) Date of Patent: Nov. 19, 2024

(54) TRENCH-GATE SOURCE FOLLOWER FOR LOW-NOISE SCALED PIXEL

(71) Applicant: Shenzhen Goodix Technology Co., Ltd., Shenzhen (CN)

(72) Inventors: Yunfei Gao, San Diego, CA (US); Tae Seok Oh, San Diego, CA (US); Jinwen Xiao, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 494 days.

(21) Appl. No.: 17/489,735

(22) Filed: Sep. 29, 2021

(65) Prior Publication Data

US 2023/0094943 A1    Mar. 30, 2023

(51) Int. Cl.
| | |
|---|---|
| H01L 27/146 | (2006.01) |
| H01L 29/423 | (2006.01) |
| H01L 29/66 | (2006.01) |
| H01L 29/78 | (2006.01) |

(52) U.S. Cl.
CPC .. H01L 27/14614 (2013.01); H01L 27/14645 (2013.01); H01L 27/14689 (2013.01); *H01L 29/42356* (2013.01); *H01L 29/4236* (2013.01); *H01L 29/66621* (2013.01); *H01L 29/66628* (2013.01); *H01L 29/7813* (2013.01)

(58) Field of Classification Search
CPC ......... H01L 27/14614; H01L 27/14645; H01L 27/14689; H01L 29/7813; H01L 29/66621; H01L 29/66628; H01L 29/42356; H01L 29/4236
See application file for complete search history.

(56) References Cited

U.S. PATENT DOCUMENTS

| | | | | |
|---|---|---|---|---|
| 2020/0035724 | A1* | 1/2020 | Machida | ................. H01L 31/10 |
| 2021/0167191 | A1* | 6/2021 | Gu | ....................... H01L 29/7813 |
| 2021/0217798 | A1* | 7/2021 | Chen | .................. H01L 27/14636 |
| 2021/0296434 | A1* | 9/2021 | Chen | .................... H01L 21/2253 |
| 2021/0305299 | A1* | 9/2021 | Huang | .............. H01L 29/66795 |
| 2022/0059587 | A1* | 2/2022 | Zang | .................. H01L 27/14636 |
| 2022/0320162 | A1* | 10/2022 | Zang | ................. H01L 27/14603 |
| 2023/0067685 | A1* | 3/2023 | Zang | ................. H01L 27/14616 |
| 2023/0223413 | A1* | 7/2023 | Zang | .................... H01L 27/1463 |
| | | | | 257/292 |

* cited by examiner

*Primary Examiner* — David Vu
*Assistant Examiner* — Brandon C Fox
(74) *Attorney, Agent, or Firm* — Finnegan, Henderson, Farabow, Garrett & Dunner, LLP

(57) ABSTRACT

A trench-gate source-follower (TGSF) transistor is described, such as for integration with image sensor pixels. The TGSF transistor is at least partially built into a trench etched into a substrate. A contiguous doped region is implanted around the inner walls of the trench to form a buried-trench current channel. A trench-gate is formed to have at least a buried portion that fills the volume of the trench. A gate oxide layer can be disposed between the buried portion of the trench-gate and the buried-trench current channel. Drain and source regions are formed on either end of the trench-gate. Activating the trench-gate causes current to flow between the drain and source regions via the buried-trench current channel around the buried portion of the trench-gate. The geometry of the buried-trench current channel can effectively increase the width of the active region of the source-follower transistor without increasing its physical layout width.

16 Claims, 11 Drawing Sheets

TRENCH-GATE SOURCE FOLLOWER FOR LOW-NOISE SCALED PIXEL

FIELD

The present invention relates generally to complementary metal-oxide semiconductor (CMOS) image sensors. More particularly, embodiments relate to trench-gate source-follower transistor designs for integration with CMOS image sensor (CIS) pixels.

BACKGROUND

Many modern electronics applications include integrated digital cameras and/or other imaging systems, which are based on complementary metal-oxide semiconductor (CMOS) image sensor (CIS) technologies. A CIS can typically include an array of pixels, each including a single photo-sensor (e.g., photodiode), or a grouping of multiple photo-sensors. Each pixel can also include supporting hardware, such as a source-follower transistor for converting the optical responses of the photo-sensors into corresponding electrical signals for use by other components. Performance of a pixel can relate to its size. For example, increasing the size of the photodiode area in the pixel can increase the photodiode's full-well capacitance (FWC), which tends to support higher dynamic range, higher contrast, and/or other image performance improvements. Similarly, increasing the active area of the source-follower transistor can improve the pixel's noise performance, such as by increasing its signal-to-noise ratio (SNR).

For any given pixel size, the footprint must be shared by both the photo-sensor(s) and the source-follower transistor. As such, any increase in the size of one forces a decrease in the size of the other, such that the pixel design conventionally represents a trade-off between image performance (relating to size and corresponding FWC of the photo-sensors) and noise performance (relating to active area of the source-follower transistor). As pixel dimensions continue to decrease, it becomes increasingly difficult to maintain acceptable noise performance while optimizing FWC.

BRIEF SUMMARY OF THE INVENTION

Embodiments provide circuits, devices, and methods for implementing a trench-gate source-follower (TGSF) transistor for integration with complementary metal-oxide semiconductor (CMOS) image sensor (CIS) pixels. The TGSF transistor is at least partially built into a trench etched into a substrate, such as into a silicon wafer substrate, an oxide diffusion region of a CIS wafer, etc. A contiguous doped region is implanted around the inner walls of the trench to form a buried-trench current channel. A trench-gate is formed to have at least a buried portion that fills the volume of the trench. A gate oxide layer can be disposed between the buried portion of the trench-gate and the buried-trench current channel. Drain and source regions of the transistor are formed on either end of the trench-gate. Activating the trench-gate causes current to flow between the gate and source regions via the buried-trench current channel around the buried portion of the trench-gate. The geometry of the buried-trench current channel can effectively increase the width of the active region of the source-follower transistor without increasing its physical layout width.

According to one set of embodiments, a method is provided for manufacturing a trench-gate source-follower (TGSF) transistor block. The method includes: forming a buried-trench current channel in a semiconductor substrate, such that the buried-trench current channel is a contiguous doped region implanted into the semiconductor substrate in trench walls that surround a trench etched into the semiconductor substrate; depositing polysilicon to overfill a volume of the trench so that a first portion of the polysilicon conforms to the volume of the trench to form a buried portion of a trench-gate, and a second portion of the polysilicon extends above a surface level of the trench, the surface level being coincident with a surface of the semiconductor substrate; patterning the second portion of the polysilicon to form an exposed portion of the trench-gate; implanting a drain region in the semiconductor substrate adjacent to a first side of the trench-gate; and implanting a source region in the semiconductor substrate adjacent to a second side of the trench-gate opposite the first side.

According to another set of embodiments, a trench-gate source-follower (TGSF) transistor block is provided. The TGSF transistor block includes: a buried-trench current channel formed in a semiconductor substrate as a contiguous doped region implanted into the semiconductor substrate in trench walls that surround a trench etched into the semiconductor substrate; a trench-gate formed by depositing polysilicon to overfill a volume of the trench so that the trench-gate comprises: a buried portion formed by a first portion of the polysilicon filling and conforming to the volume of the trench; and an exposed portion formed by patterning a second portion of the polysilicon that extends above a surface level of the trench, the surface level being coincident with a surface of the semiconductor substrate; a drain region implanted in the semiconductor substrate adjacent to a first side of the trench-gate; and a source region implanted in the semiconductor substrate adjacent to a second side of the trench-gate opposite the first side.

According to another set of embodiments, a complementary metal-oxide semiconductor (CMOS) image sensor (CIS) pixel physical architecture is provided. The CIS pixel physical architecture includes: a semiconductor substrate; a pixel block having a set of photodiodes integrated with the semiconductor substrate; and an oxide diffusion region integrated with the semiconductor substrate adjacent to the set of photodiodes and having at least a trench-gate source-follower (TGSF) transistor block disposed thereon. The TGSF transistor block includes: a buried-trench current channel formed in the oxide diffusion region as a contiguous doped region implanted into the semiconductor substrate in trench walls that surround a trench etched into the semiconductor substrate; a trench-gate formed by depositing polysilicon to overfill a volume of the trench so that the trench-gate comprises: a buried portion formed by a first portion of the polysilicon filling and conforming to the volume of the trench; and an exposed portion formed by patterning a second portion of the polysilicon that extends above a surface level of the trench, the surface level being coincident with a surface of the semiconductor substrate; a drain region implanted in the oxide diffusion region adjacent to a first side of the trench-gate; and a source region implanted in the oxide diffusion region adjacent to a second side of the trench-gate opposite the first side.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
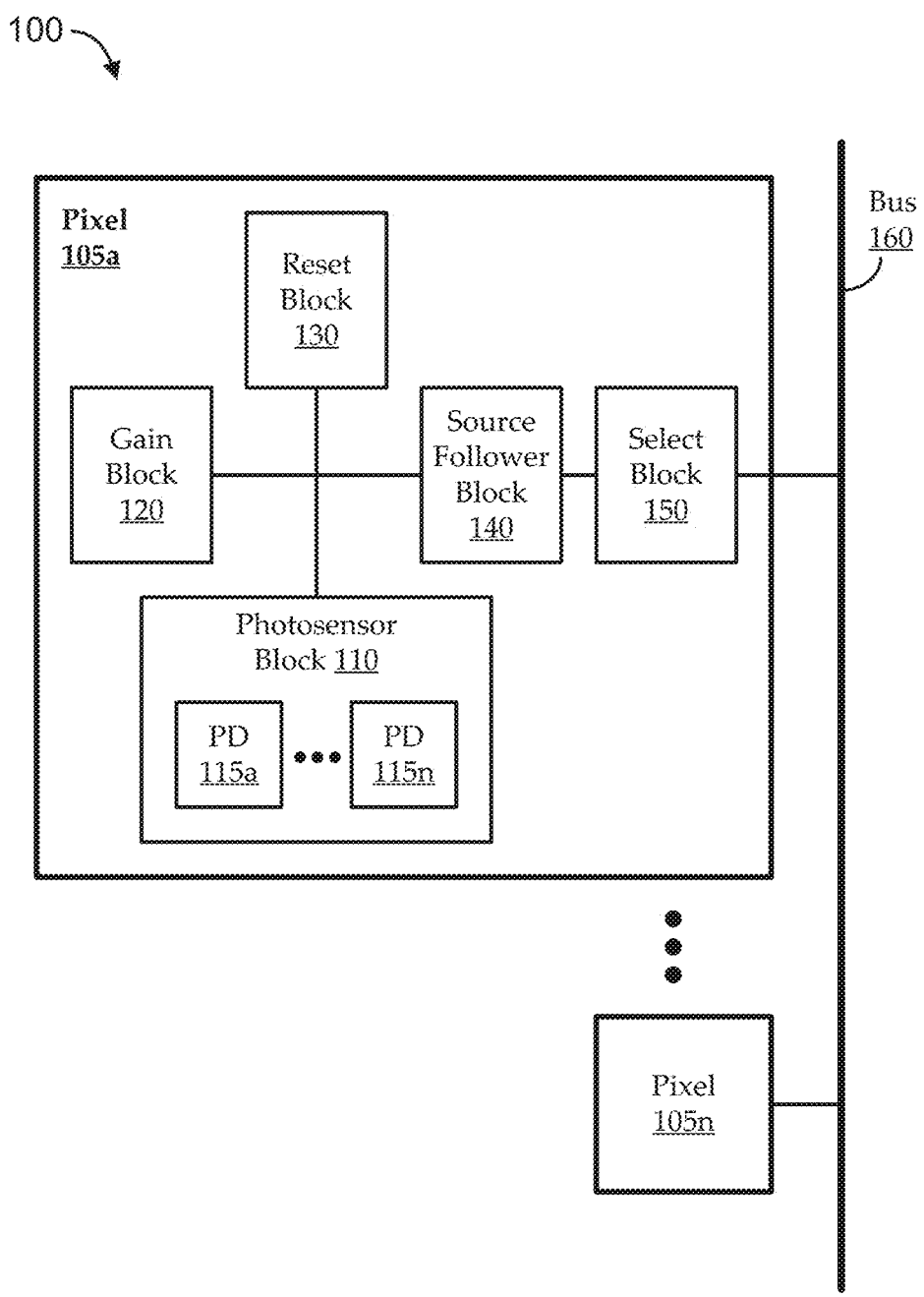
FIG. 1 shows a simplified block diagram of a portion of an illustrative digital imaging system, as context for various embodiments described herein.

FIG. 1 shows a simplified block diagram of a portion of an illustrative digital imaging system 100, as context for various embodiments described herein. The digital imaging system 100 is built around a complementary metal-oxide semiconductor (CMOS) image sensor (CIS) technology. Such a CIS system can typically include an array of pixels 105, such as millions of pixels 105 arranged in rows and columns. Each pixel 105 can include a photo-sensor block 110, which can include a single photodiode 115 (e.g., or any suitable photo sensor), or a grouping of multiple photodiodes 115. For example, each pixel 105 can be implemented with a grouping of four photodiodes 115 arranged in a Beyer color pattern (e.g., one red photodiode 115, one blue photodiode 115, an two green photodiodes 115), or any other suitable pattern.

The pixel 105 also includes additional components to facilitate sage of the photo-sensor block 110 for optical sensing. As illustrated, embodiments can include a gain block 120, a reset block 130, a source-follower block 140, and a select block 150. The gain block 120 can control gain for the pixel 105, such as by implementing dual conversion gain (DCG). The reset block 130 can selectively reset the pixel 105 components. The source-follower block 140 can support conversion of outputs from the photo-sensor block 110 into an electrical signal indicative of optical information detected by the photo-sensor block 110. The select block 150 can support selection of the pixel 105 signals from among the array of pixels 105, for example responsive to a control signal received via a bus 160. For example, the bus 160 may be a column select bus, or the like.

As technology progresses, there has tended to be a drive in many application contexts to reduce the sizes pixels 105. Indeed, many digital imaging applications are seeking ever-increasing numbers and densities of pixels 105 on their image sensor chips (i.e., driving decreases in pixel 105 sizes), while also demanding that designs continue to meet or exceed multiple performance parameters, such as relating to image contrast, dynamic range, capture frame-rate, signal-to-noise ratio (SNR), power consumption, etc. However, it has been demonstrated that certain performance parameters of pixels 105 tend to be adversely impacted by reducing the sizes of components within the pixel 105. For example, decreasing the size of a photodiode 115 in the photo-sensor block 110 can decrease its full-well capacitance (FWC), which can tend to yield lower dynamic range, lower contrast, and/or other image performance reductions. Similarly, decreasing the active area of the source-follower block 140 can reduce the pixel's 105 noise performance, such as by reducing its signal-to-noise ratio (SNR). For example, decreasing the active area of the source-follower block 140 can tend to increase its susceptibility to low-frequency noise (sometimes referred to as 1/f noise), and/or burst noise (also referred to as random telegraph signal (RTS) noise, impulse noise, bi-stable noise, etc.). Some conventional pixel 105 designs seek to maximize component sizes within the limited footprint of the pixel 105, but the footprint of each pixel 105 is shared by all its components; increasing the size of one component (e.g., the photo-sensor block 110) tends to require decreasing the size of another (e.g., source-follower block 140). As such, conventional pixel 105 designs are often forced into a trade-off between image performance (relating to size and corresponding FWC of the photo-sensors) and noise performance (relating to active area of the source-follower transistor).

Figure 2A:
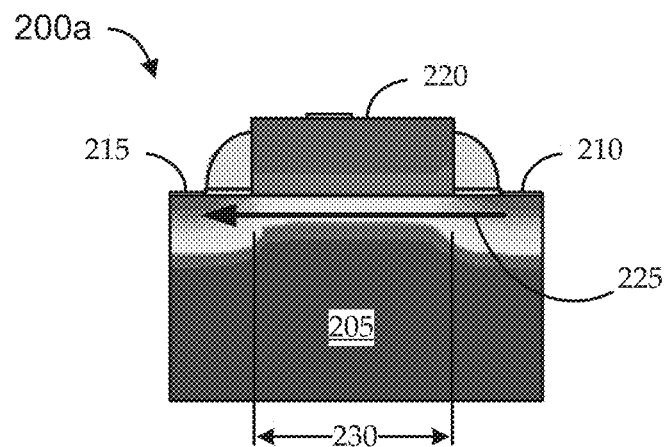
FIGS. 2A and 2B show a side cross-sectional view and a perspective view, respectively, of a conventional source-follower block implemented as a planar source-follower transistor, as is typical for conventional CIS pixel designs.
Figure 2B:
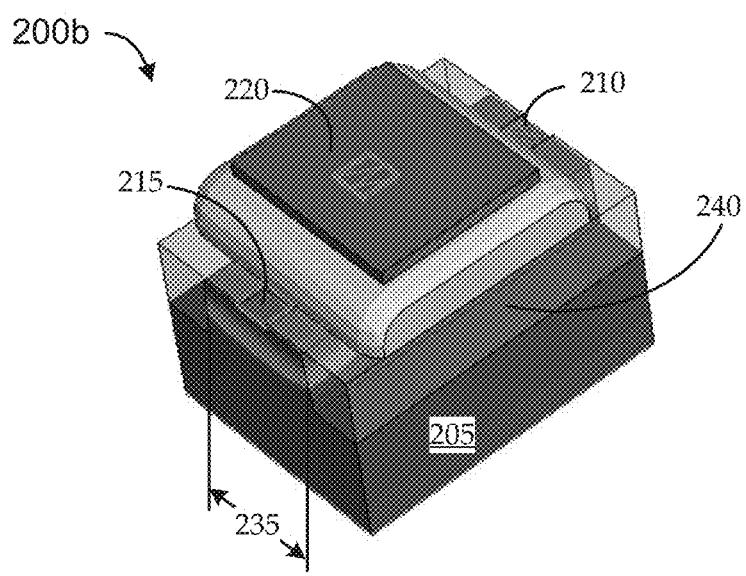

As pixel 105 dimensions continue to decrease, it is becoming increasingly difficult even to reach an acceptable trade-off between image performance and noise performance. For the sake of added context, FIGS. 2A and 2B show a side cross-sectional view and a perspective view, respectively, of a conventional source-follower block 140 implemented as a planar source-follower transistor 200, as is typical for conventional CIS pixel designs. As illustrated, the planar source-follower transistor 200 includes a drain region 210, a source region 215, and a gate region 220, all implemented on a substrate 205. For example the substrate 205 is a p-doped silicon wafer, each of the drain region 210 and the source region 215 is a respective n-doped region of the substrate 205, and the gate region 220 is a polysilicon structure deposed built (e.g., by deposition) on the substrate 205. Applying a gate voltage to the gate region 220 can cause a current channel to form and current to flow between the drain region 210 and the source region 215 in the direction of arrow 225. The length of the current channel (L) is shown as dimension 230 in FIG. 2A. The active region width (W) of the planar source-follower transistor 200 is shown in FIG. 2B as dimension 235. Also as shown in FIG. 2B, the active region can be bounded (e.g., isolated from neighboring devices) using isolation regions 240, such as shallow trench isolation (STI) regions.

Realizing a particular level of performance of a CIS pixel can involve implementing the source-follower block 140 to yield at least a threshold level of transconductance (g_m) within a threshold acceptable noise level. The amount of transconductance can functionally correspond to performance characteristics, such as frame rate, power consumption, and certain types of noise. In general, the transconductance of a generalized source-follower transistor at the saturation region can be computed as:

$$g_m = W C_{ox} v_{sat}$$

where W is the width of the source-follower transistor (e.g., dimension 235 of FIG. 2B in a conventional design), C_ox is the oxide capacitance, and v_sat is the saturation voltage. It can be seen that the transconductance of the source-follower transistor tends to be proportional to its width, such that a decrease in width tends to yield a corresponding decrease in transconductance-related performance.

Further, the voltage noise at the source-follower transistor gate (S_vg) can be computed as:

$$S_{Vg} = \frac{M}{C_{ox}^2 WL} \frac{1}{f^\beta}$$

where M is an empirical parameter, and β is a frequency-related parameter. The voltage signal at the source-follower transistor gate tends to be proportional to the gate capacitance, described by C_ox*W*L, where L is the current channel length (e.g., dimension 230 of FIG. 2A in a conventional design). From the gate voltage noise and the gate voltage signal, it can be derived that the SNR for the source-follower transistor is functionally related to $C_{ox}^3 * W^2 * L^2$. Thus, it can be seen that the SNR of the source-follower transistor tends to be proportional to its width and length, such that a decrease in the size of the source-follower transistor tends to yield a corresponding decrease in noise performance. Notably, in conventional designs, such noise performance tends to further reduced at the device edges, such as in the isolation regions 240. For example, current flowing in the current channel can become trapped in STI regions and can contribute additional noise.

Many modern digital imaging applications have pushed pixel dimensions down to scales of around 1.12 micrometers. Even at such small scales, some conventional designs based on a planar source-follower transistor 200 have achieved sufficient transconductance ($g_m$) at an acceptable noise level to provide high CIS performance. However, as pixel dimensions continue to decrease, it becomes exceedingly difficult, impractical, or even impossible, to maintain desired levels of both transconductance ($g_m$) and SNR.

As noted above, in the conventional planar source-follower transistors 200, the gate region 220 is disposed on top of the substrate 205. Applying a gate voltage to the gate region 220 can cause a current channel to form just below surface of the substrate 205 (just below the gate region 220) between the drain region 210 and the source region 215. The length and width of the formed current channel thus relates to the length and width of the gate region 220; the physical layout width of the current channel is approximately the effective active width of the current channel. For example, reducing either the length or width of the gate region 220 will tend to reduce the length or width of the current channel, thereby impacting performance of the source follower.

Embodiments described herein provide a novel source-follower block 140 implemented using a trench-gate source-follower (TGSF) transistor. In general, embodiments of TGSF transistors described herein include a trench etched into the silicon substrate. The walls around the trench are implanted (e.g., as an n-doped region isolated from drain and source regions), and a trench-gate region is formed to include a polygate structure that at least fills the trench. Applying a gate voltage to the polygate causes a buried current channel to form around the trench, which provides parallel current paths along the walls of the trench around the multiple sides of the polygate. The active region of the TGSF can thereby be appreciably larger than the physical layout width of the current channel. As such, TGSF transistor can provide better performance (e.g., increases in transconductance-related and/or noise-related performance) than a conventional planar source-follower transistor of the same physical layout size.

Figure 3A:
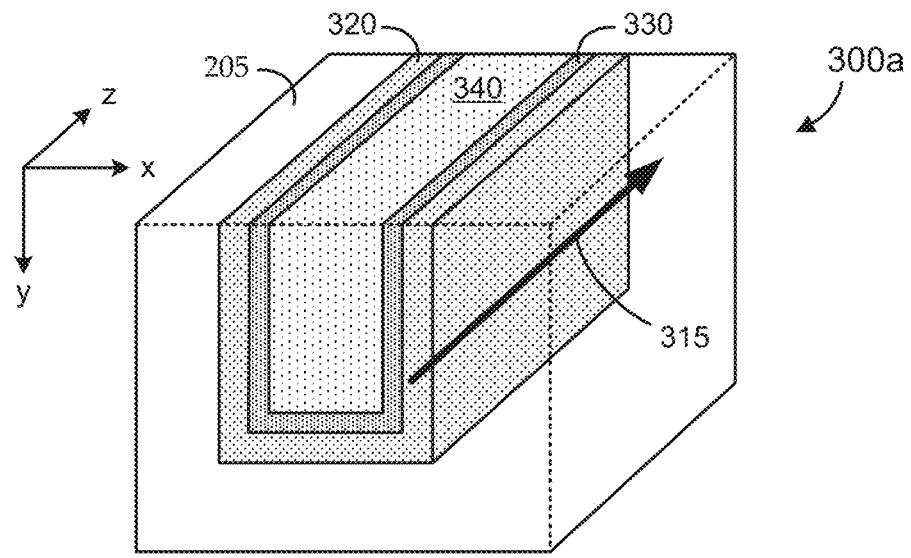
FIGS. 3A-3D show various simplified views of an illustrative novel trench-gate source-follower (TGSF) transistor, according to various embodiments described herein.

FIGS. 3A-3D show various simplified views of an illustrative novel trench-gate source-follower (TGSF) transistor 300, according to various embodiments described herein. The TGSF transistor 300 can be an implementation of the source follower block 140 of FIG. 1. Turning first to FIG. 3A, a perspective view of a gate region of the TGSF transistor 300 is shown. In some implementations, source and drain regions of the TGSF transistor 300 are implemented in substantially the same manner as in a conventional planar-type of source-follower transistor. As illustrated, the gate region can include a trench etched into a silicon substrate 205, such as a portion of a silicon wafer. The walls of the trench are implanted to form a buried current channel 320. For example, the substrate is a p-type substrate, and the buried-trench current channel 320 is an n-doped region. The trench is filled by a polygate structure that forms a trench-gate 340, which is separated from the buried-trench current channel 320 by a layer of gate oxide 330. When a gate voltage is applied to the trench-gate 340, current (e.g., electrons) is allowed to flow across the buried current channel 320. For example, current flows primarily in the buried-trench current channel 320 along both sides of the trench-gate 340 in the direction of arrow 315.

Figure 3B:
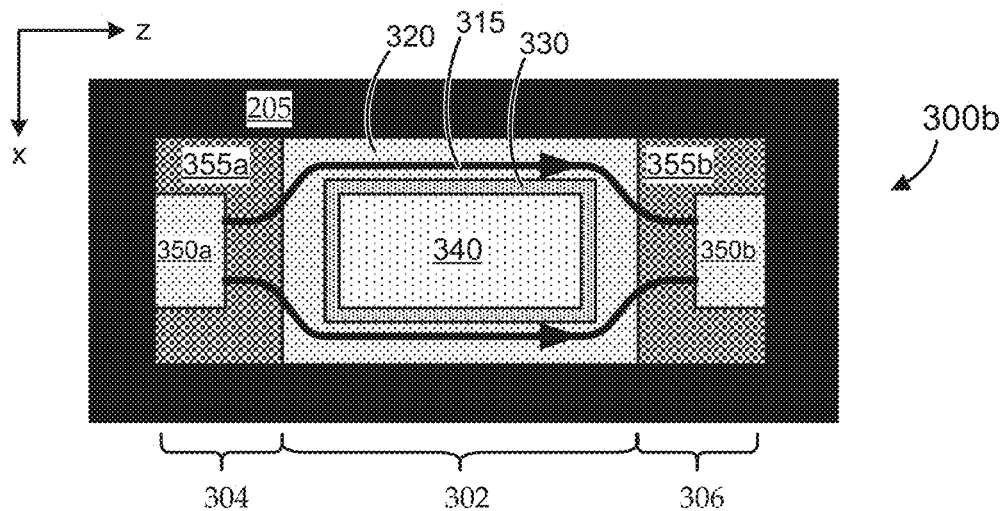

FIG. 3B shows a top-down cut view of the TGSF transistor 300b corresponding to a cut in the x-z plane, according to the illustrated axis convention shown in FIG. 3A. The view shows a gate region 302, a drain region 350, and a source region 360. As described with reference to FIG. 3A, the gate region 302 includes a trench-gate 340 formed in a trench etched into the substrate 205. The trench-gate 340 is surrounded by a gate oxide 330 layer, and the walls of the trench are implanted to form a buried-trench current channel 320. The buried-trench current channel 320 is bounded by a drain region 304 and a source region 306. Each of the drain region 304 and the source region 306 can be formed as a respective higher-doped region 350 implanted in a lighter-doped region 355 to form a doping gradient. For example, each lighter-doped region 355 is a so-called lightly-doped drain (LDD) region. For example, each of the drain region 350 and the source region 360 include respective n-doped implant regions. As noted above, when a gate voltage is applied to the trench-gate 340, current can flow across the buried-trench current channel 320 at least along both sides of the trench-gate 340 in the direction of arrows 315 (e.g., from the drain region 304 to the source region 306).

Figure 3C:
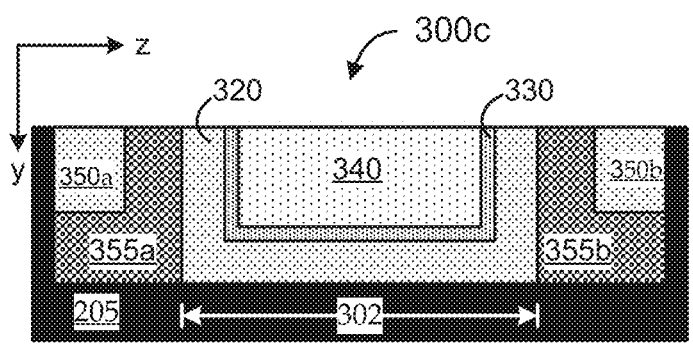
Figure 3D:
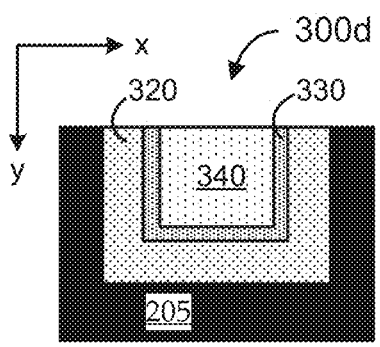

FIGS. 3C and 3D show a length-wise cut view of the TGSF transistor 300c (cut in the y-z plane) and a width-wise cut view of the TGSF transistor 300d (cut in the y-x plane), respectively. The view of FIG. 3C shows the same regions and components as in FIG. 3B, including the gate region 302, drain region 304, and source region 306. The view of FIG. 3D is cut through the gate region 302, such that only components of the gate region 302 can be seen. From the views of both FIGS. 3C and 3D, it can be seen that the gate region 302 is implemented by forming a trench-gate 340 in a trench etched into the substrate 205, implanting the walls of the trench to for a buried-trench current channel 320, and separating the buried-trench current channel 320 from the trench-gate 340 by a gate oxide 330 layer.

The views of FIGS. 3A-3D are highly simplified views. For example, while various regions and structures are shown as having square corners and defined edges, practical implementations of such regions and structures have generally organic shapes. As such, the boundaries or edges of such regions and structures practically do not have perfectly definable boundaries, and tend instead to be defined in a more statistical manner (e.g., by nominal values, process corners, etc.), as will be appreciated by those of skill in the art. Thus, the various illustrated regions and structures are intended generally to show general relative arrangements of structures and regions, general isolation between structures and regions, and the like; but are not intended to define specific shapes, sizes, boundaries, and/or other features.

As described herein, embodiments of the TGSF transistor 300 include a gate region 302 that is at least partially formed within an etched trench to provide a buried-trench current channel 320. FIGS. 4A-5B illustrate two approaches for manufacturing such a TGSF transistor 300: an "etch first" approach; and an "implant first" process. The etch first approach generally etches the trench prior to implanting doped regions into the walls of the etched trench to create the buried-trench current channel 320. The implant first process generally dopes a large region (e.g., a large well) in the substrate prior to etching the trench into the already doped region to create the buried-trench current channel 320.

FIGS. 4A-4L show simplified views of a sequence of stages 400 of an illustrative etch first approach, according to various embodiments described herein. Each stage 400 is illustrated by two views of a portion of a CMOS wafer: a simplified length-wise cut view on the right (e.g., similar to the cut view of FIG. 3C); and a simplified width-wise cut view on the left (e.g., similar to the cut view of FIG. 3D). For added context, each simplified length-wise cut view shows a source-follower transistor region (shown as region 402 in FIG. 4A) adjacent to a select transistor region (shown as region 404 in FIG. 4A), such as corresponding to a typical layout of a source-follower block 140 and a select block 150 in a CMOS image sensor pixel layout.

Figure 4A:
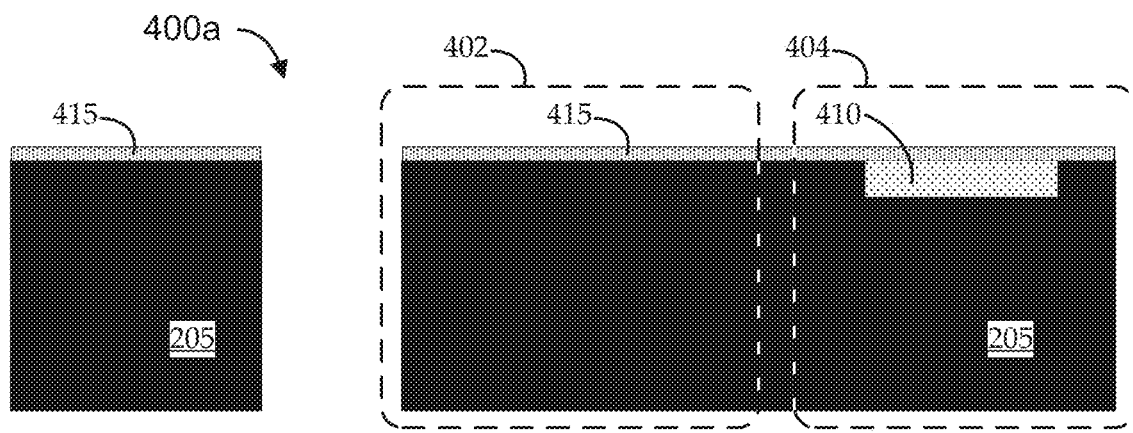
FIGS. 4A-4L show simplified views of a sequence of stages of an illustrative etch first approach, according to various embodiments described herein.

For the sake of context, FIG. 4A shows a first stage 400a, which can be similar to a stage of manufacture of a conventional planar-type source-follower transistor. As shown, a current channel region 410 (e.g., an n-type well) has already been implanted for the select transistor (in the illustrated select transistor region 404), and a screen oxide layer 415 is formed on across the surface of the silicon substrate 205 (e.g., to protect the exposed surface).

Figure 4B:
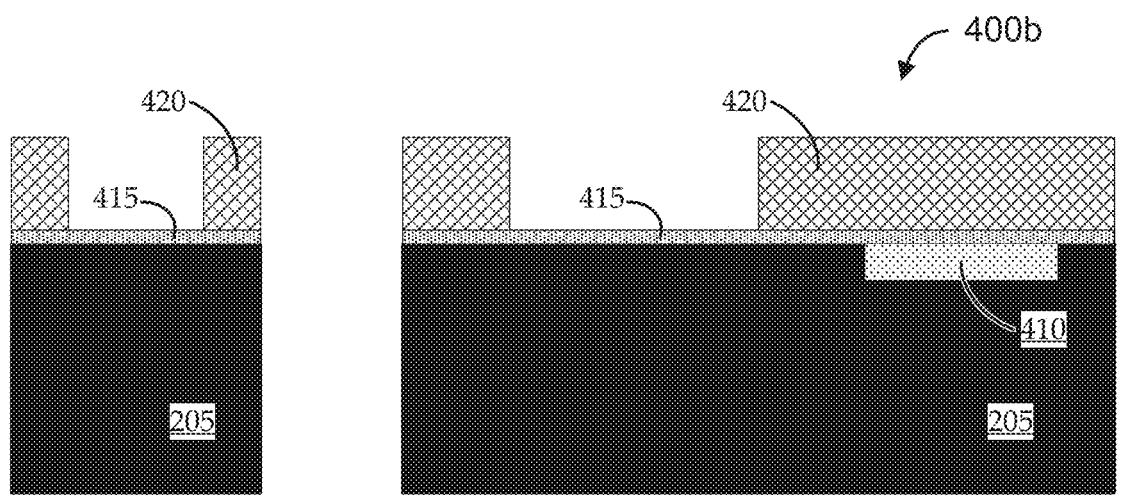

FIG. 4B shows a next stage 400b of the etch first approach, in which a hard mask 420 is deposited on top of the screen oxide layer 415. The hard mask 420 is sized to the geometry of the trench to be etched. As described above, some embodiments of the TGSF transistor 300 are manufactured to have geometry that is the same as, or similar to, that of a conventional planar-type source-follower transistor from a top-down layout view. In particular, such embodiments can be manufactured so that the top of the polygate has a same length and width (pitch) as that of a conventional planar-type source-follower transistor. As such the hard mask 420 in stage 400b can be patterned using a conventional pattern that would be used for manufacturing a conventional planar-type source-follower transistor of the same polygate dimensions.

For example, to manufacture a conventional planar-type source-follower transistor, an n-type buried channel mask, or "NBC mask," of the same (or similar) shape as the hard mask 420 is used to implant an n-typed well just below the surface of the substrate 205. In such a conventional approach, the resulting implanted region can look similar to the region 410 implanted for the select transistor. In a later stage of such a conventional approach, a polygate can be deposited and patterned on top of each of those implanted regions to form the select transistor and the planar-type source-follower transistor.

Figure 4C:
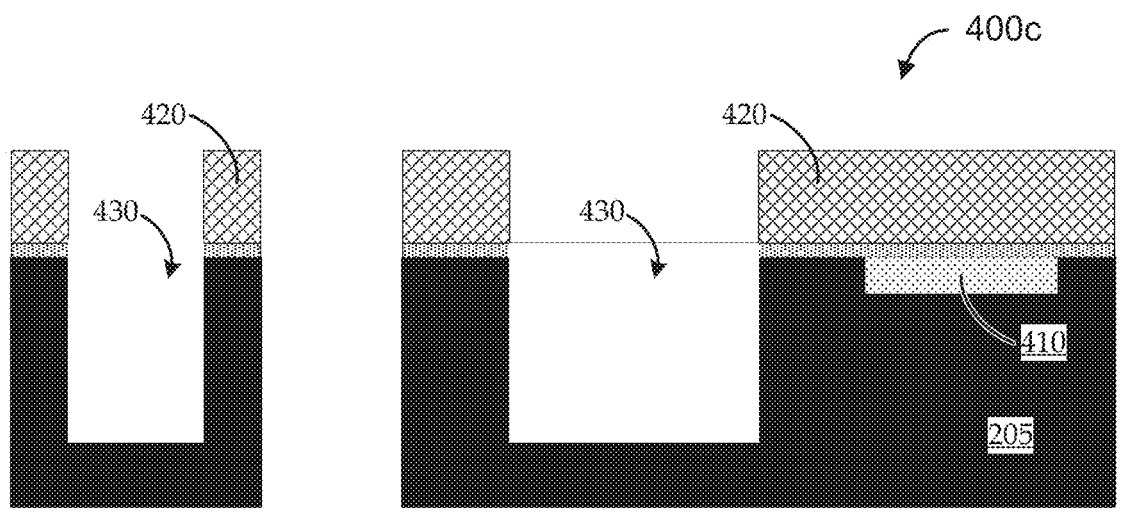

In contrast, FIG. 4C shows a next stage 400c of the etch first approach, in which a trench 430 is etched into the substrate 205 based on the geometry of the hard mask 420 from stage 400b. The hard mask 420 is made of a material that is substantially unaffected by the etching process. For example, chemical etching is applied over at least the illustrated portion of the surface of the wafer, and the hard mask 420 causes etching to be confined only to the unmasked areas. Thus, the geometry of the hard mask 420 at least partially defines the geometry of the trench 430. The dimensions of the trench 430 can be determined based on a number of factors. In some embodiments, the width of the trench 430 is smaller than its length.

Figure 4D:
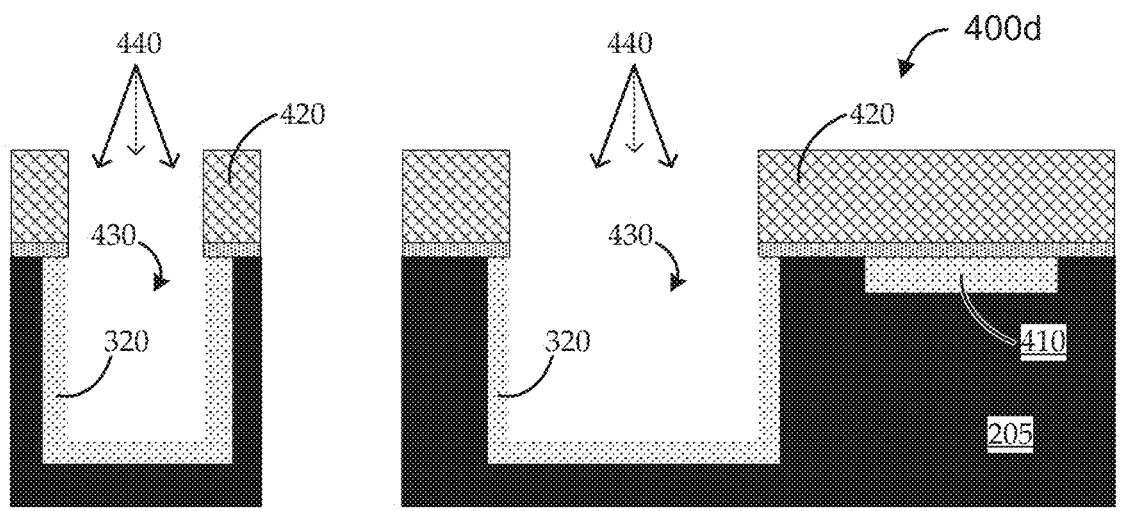

FIG. 4D shows a next stage 400d of the etch first approach, in which implanting is performed on the walls of the trench 430 to form the buried-trench current channel 320. To reach the sidewalls of the trench 430, the implanting can be performed at one or more angles not normal to the surface of the wafer (represented by solid arrows 440). For example, implanting of an n-channel well for the source-follower transistor is conventionally performed a single step at approximately 90 degrees (i.e., pointing normal to the surface of the wafer, as represented by the dashed arrow). The implanting at stage 400d can be performed in multiple steps. For example, four implanting steps are used to implant each of the four sidewalls of the trench 430. Each implanting step is performed at a corresponding angle based at least on the depth of the trench 430, and the geometry of the opening (i.e., the length and width of the trench 430). For example, each implanting step is performed at an angle that is 15-20 degrees off-normal relative to the surface of the wafer.

Figure 4E:
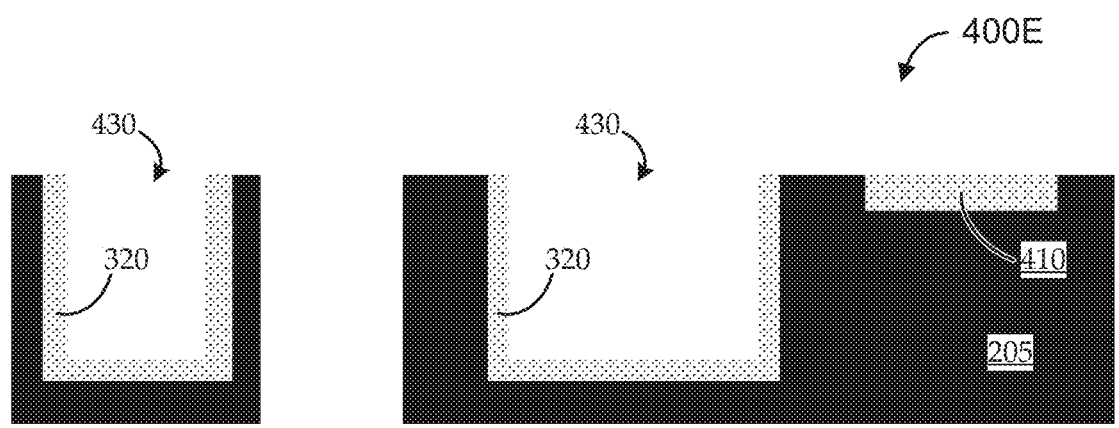

FIG. 4E shows a next stage 400e of the etch first approach, in which the hard mask 420 is removed, and remaining portions of the screen oxide layer 415 are removed.

Figure 4F:
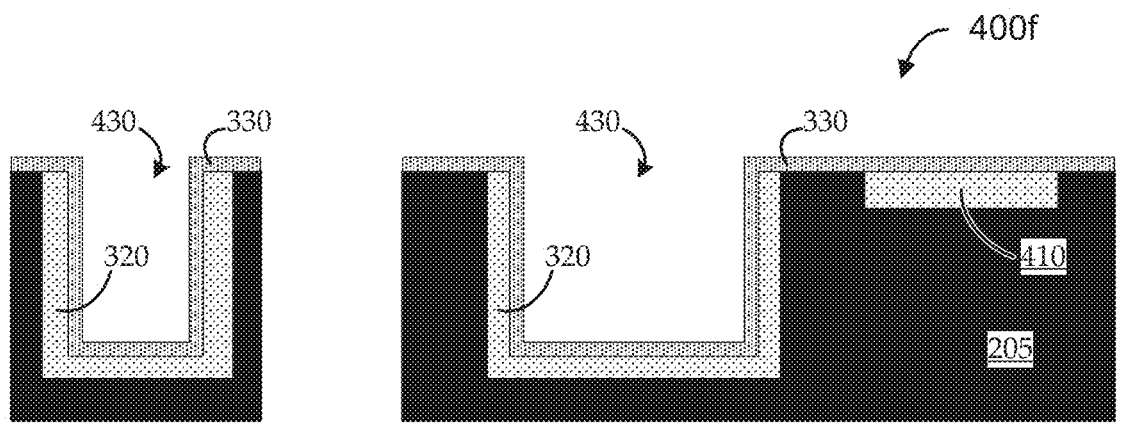

FIG. 4F shows a next stage 400f of the etch first approach, in which the surface of the wafer is cleaned and a gate oxide layer 330 is grown on the surface of the wafer. It can be seen that the buried-trench current channel 320 is implanted behind all walls of the trench 430, and all walls of the trench 430 are also coated by the gate oxide layer 330.

Figure 4G:
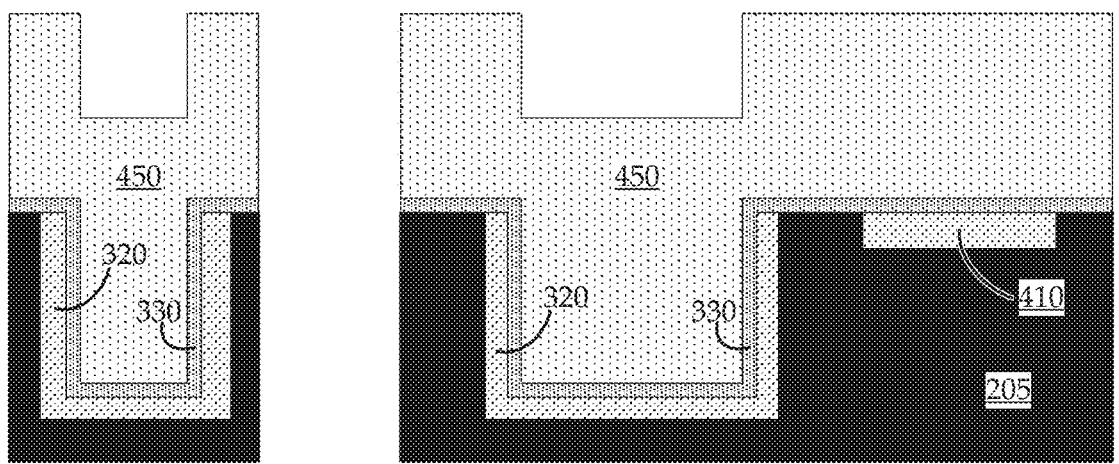

FIG. 4G shows a next stage 400g of the etch first approach, in which polysilicon 450 is deposited over the surface of the wafer (at least in the illustrated region), including filling the entire volume of the trench 430. This polysilicon 450 will subsequently be patterned to form the polygates of the TGSF transistor 300 (i.e., the trench-gate 340) and the select transistor. In some embodiments, it is desirable for the top surface of the polygates to be at a certain gate height above the surface of the wafer, such as to support further processing. However, as illustrated, the height of the deposited polysilicon 450 can be lower in the region of the trench 430 than in surrounding regions. As such, in some embodiments, the polysilicon 450 is deposited in stage 400g so that the reduced height in the region of the trench 430 is still at least the gate height.

Figure 4H:
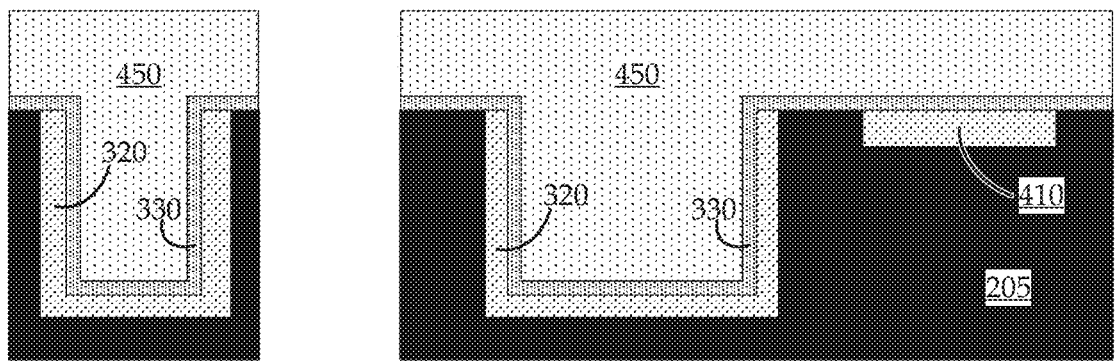

FIG. 4H shows a next stage 400h of the etch first approach, in which the polysilicon 450 deposited in stage 400g is polished to a desired consistent height. In some embodiments, polysilicon chemical-mechanical polishing (CMP) is used to effectively grind down and polish the polysilicon 450 to have a smooth and consistent surface. It can be seen that, while the top surface of the polysilicon 450 is consistent after stage 400h, the depth of the polysilicon 450 adapts to fill the volume of the trench 430.

Figure 4I:
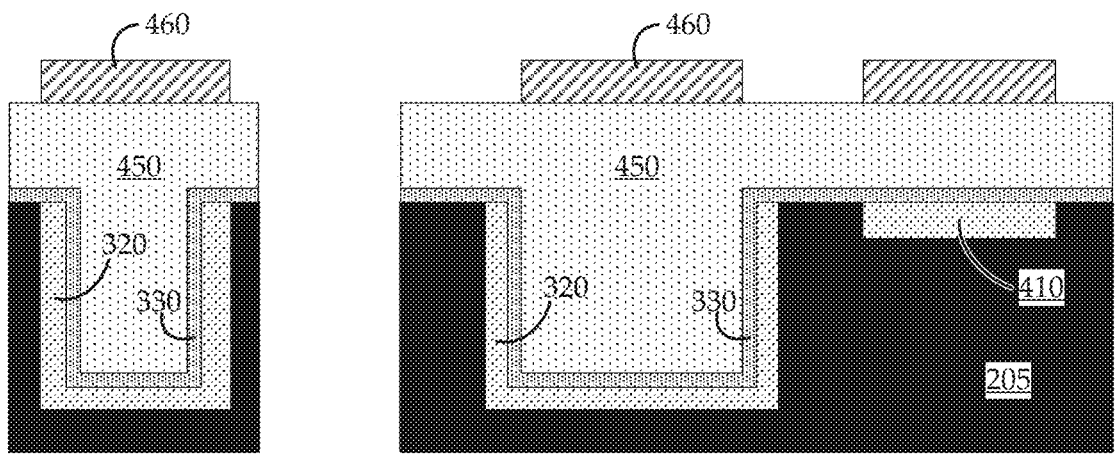

FIG. 4I shows a next stage 400i of the etch first approach, in which another hard mask 460 is deposited and patterned on top of the polysilicon 450.

Figure 4J:
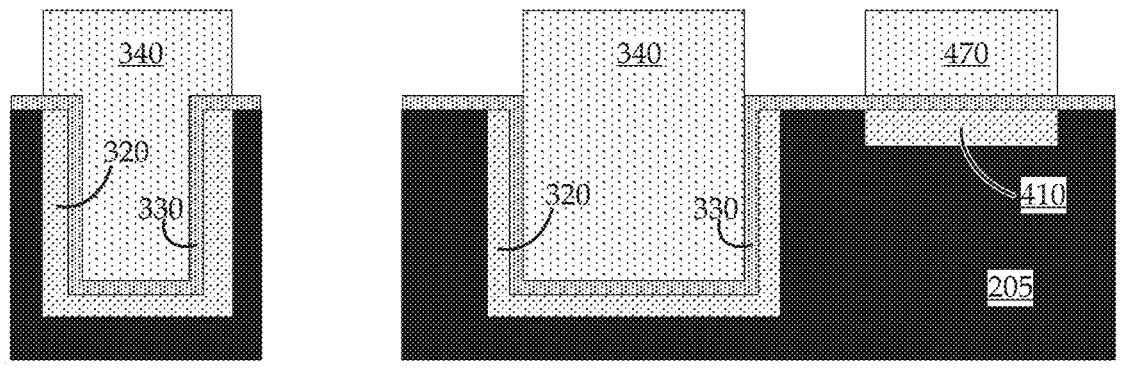

FIG. 4J shows a next stage 400j of the etch first approach, in which the polysilicon 450 is etched based on the geometry of the hard mask 460, and the hard mask 460 is stripped away. The etching leaves behind polysilicon 450 in geometries corresponding to respective polygates. In particular, the etching effectively forms the trench-gate 340 for the TGSF transistor 300 and a select gate 470 for the select transistor. As noted above, the geometry of the trench-gate 340 can be etched to look the same, from a top-down layout view, as that of a conventional planar-type source-follower transistor. However, below the surface of the wafer, it can be seen that the geometry of gate region includes the trench-gate 340 having buried walls surrounded by the gate oxide 330 layer and buried-trench current channel 320.

Figure 4K:
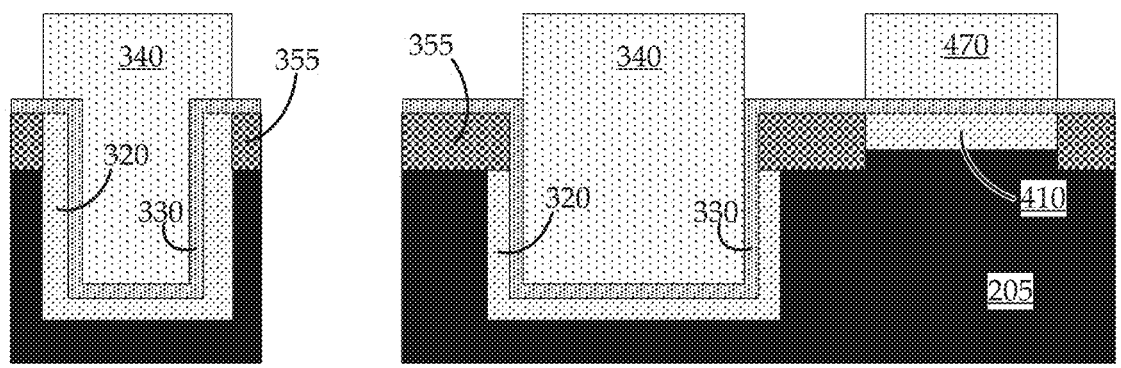

FIG. 4K shows a next stage 400k of the etch first approach, in which the lighter-doped regions 355 (e.g., LDD implants) are implanted for at least the drain region 304 and the source region 306. In some embodiments, as illustrated, the lighter-doped regions 355 are implanted form wells adjacent to the walls of the buried-trench current channel 320 running along the length of the TGSF transistor 300 (in the z direction, according to the convention of FIGS. 3A-3D), and the lighter-doped regions 355 are implanted to overtake the ends of the buried-trench current channel 320 at the source and drain ends of the TGSF transistor 300. Such overtaking of the source and drain ends of the buried-trench current channel 320 can help to ensure good conduction between the buried-trench current channel 320 and the lighter-doped regions 355 when current is flowing through the channel.

It can be seen that etching of the polysilicon 450 in stage 400j can also support performance of the lighter-doped regions 355, and/or other conduction features. For example, the polysilicon 450 can be etched so that the trench-gate 340 overlaps the silicon in the x-direction (according to the convention of FIGS. 3A-3D), but is substantially aligned with the edges of the trench 430 in the z-direction (according to the convention of FIGS. 3A-3D). The overlap of the trench-gate 340 with the silicon substrate 205 in the x-direction can facilitate covering of the current flow in the width direction. Aligning the edges of the trench-gate 340 to the trench 430 edges in the z-direction supports conductive coupling of the lighter-doped regions 355 with the buried-trench current channel 320. For example, manufacturing process variations could result in situations where an overlap between the trench-gate 340 and the silicon substrate 205 in the z-direction cuts off the conductive coupling between the lighter-doped regions 355 and the buried-trench current channel 320.

In alternative embodiments, rather than implanting the lighter-doped regions 355 in stage 400k, the lighter-doped regions 355 can be implanted prior to implanting the buried-trench current channel 320, and the buried-trench current channel 320 is implanted in a manner that ensures proper conductive coupling between the two. In some such embodiments, the lighter-doped regions 355 can be implanted prior to etching the trench 430, such as prior to stage 400a, between stages 400a and 400b, or between stages 400b and 400c. In other such embodiments, the lighter-doped regions 355 can be implanted subsequent to etching the trench 430, but prior to implanting the buried-trench current channel 320, such as between stages 400c and 400d.

Figure 4L:
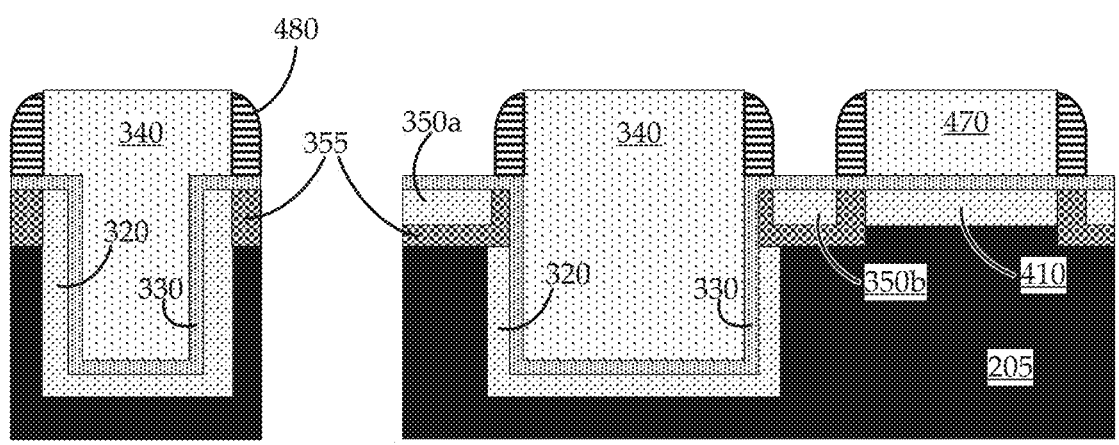

FIG. 4L shows a next (e.g., final) stage 400l of the etch first approach, in which the higher-doped regions 350 are implanted in the lighter-doped regions 355 to form the drain region 304 and the source region 306, spacers 480 are deposited and patterned, and contacts (not shown) are patterned. In some embodiments, after stage 400l, from a top-down layout view, the formed TGSF transistor 300 can look the same as a conventional planar-type source-follower transistor. For example, the trench-gate 340 of the formed TGSF transistor 300 can have the same physical layout length and width as that of a polygate of a conventional planar-type source-follower transistor.

Figure 5A:
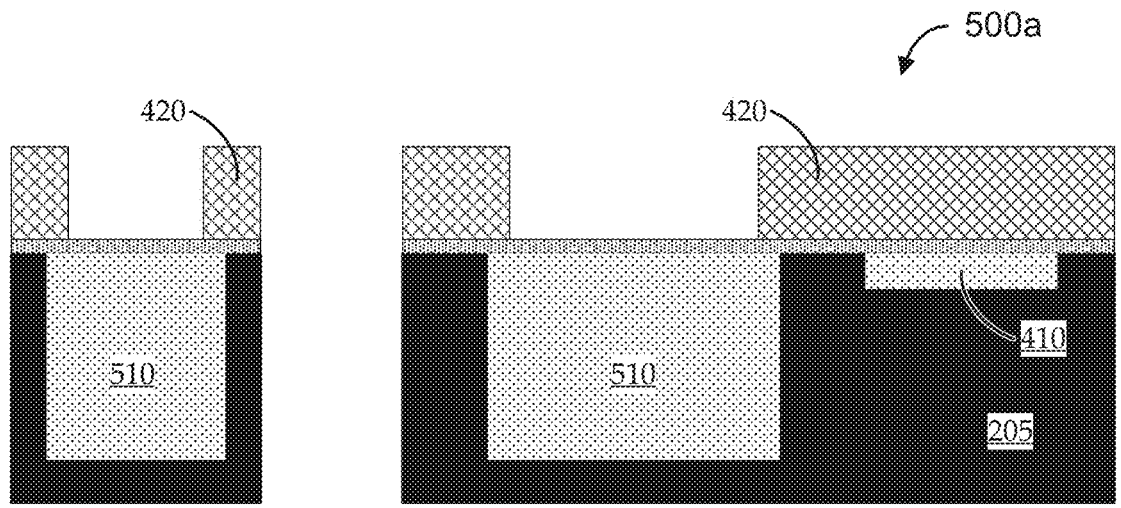
FIGS. 5A and 5B show simplified views of two stages of an illustrative implant first approach, according to various embodiments described herein.
Figure 5B:
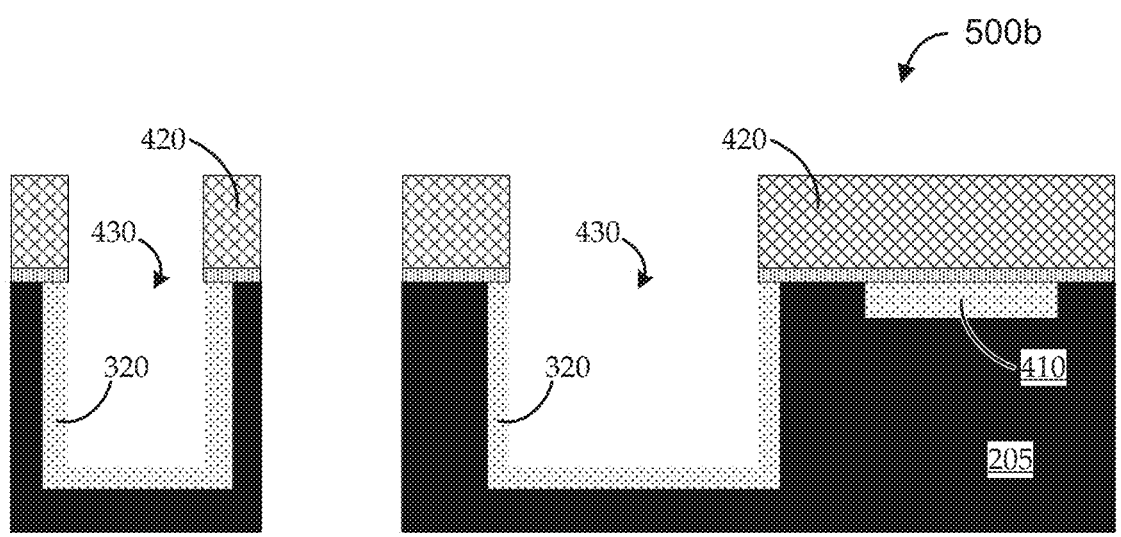

FIGS. 5A and 5B show simplified views of two stages 500 of an illustrative implant first approach, according to various embodiments described herein. Similar to FIGS. 4A-4L, each stage 500 is illustrated by two views of a portion of a CMOS wafer (a simplified length-wise cut view on the right, and a simplified width-wise cut view on the left), and each simplified length-wise cut view shows a source-follower transistor region adjacent to a select transistor region. The two stages 500 are intended to combine with stages of the etch first approach of FIGS. 4A-4L, as described below, to yield the implant first approach. For example, as with the etch first approach, the implant first approach can begin at stages 400a and 400b, as shown in FIGS. 4A and 4B. In particular, a current channel region 410 is already implanted for the select transistor, a screen oxide layer 415 is formed on across the surface of the silicon substrate 205, and a hard mask 420 is deposited on top of the screen oxide layer 415 in accordance with the geometry of the trench to be etched.

Turning to FIG. 5A, a next stage 500a of the implant first approach is shown, in which an implant region 510 is formed. For example, a large n-type well is implanted below the surface of the substrate 205, via the opening formed by the hard mask 420, to form an implant region 510 that is larger than the desired trench 430. The implanting can involve angling the implant direction (e.g., as described above), so that the implanting extends into regions below the edges of the hard mask 420. Those regions will ultimately become the buried-trench current channel 320. Such implanting can involve implants and/or multiple steps at multiple angles.

FIG. 5B shows a next stage 500b of the implant first approach, in which a trench 430 is etched into the substrate 205 based on the geometry of the hard mask 420 (e.g., from stage 400b). As illustrated, because the region of the trench 430 is already implanted, the etching automatically forms the buried-trench current channel 320. For example, the end of stage 5B can look similar to the end of stage 4D. As such, the remaining stages of the implant first approach can follow the remaining stages 400e-400l of the etch first approach shown in FIGS. 400E-400L.

Whether formed by the etch first approach or by the implant first approach, the resulting TGSF transistor 300 can be formed to look the same (from a top-down layout view) as a conventional planar-type source-follower transistor. For example, the trench-gate 340 of the formed TGSF transistor 300 can have the same physical layout length and width as that of a polygate of a conventional planar-type source-follower transistor. However, below the surface of the wafer, the buried trench-gate 340 is surrounded by the buried-trench current channel 320 to form a current channel with an appreciably different effective active width.

Figure 6A:
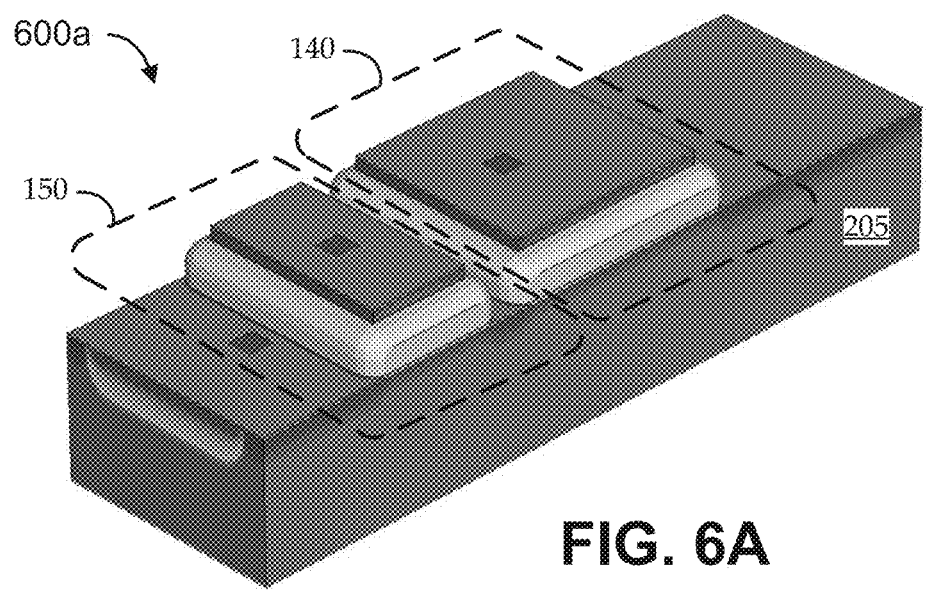
FIGS. 6A-6C show a simulated implementation of the TGSF transistor in a typical installed context on an oxide diffusion region (e.g., of a silicon wafer).
Figure 6B:
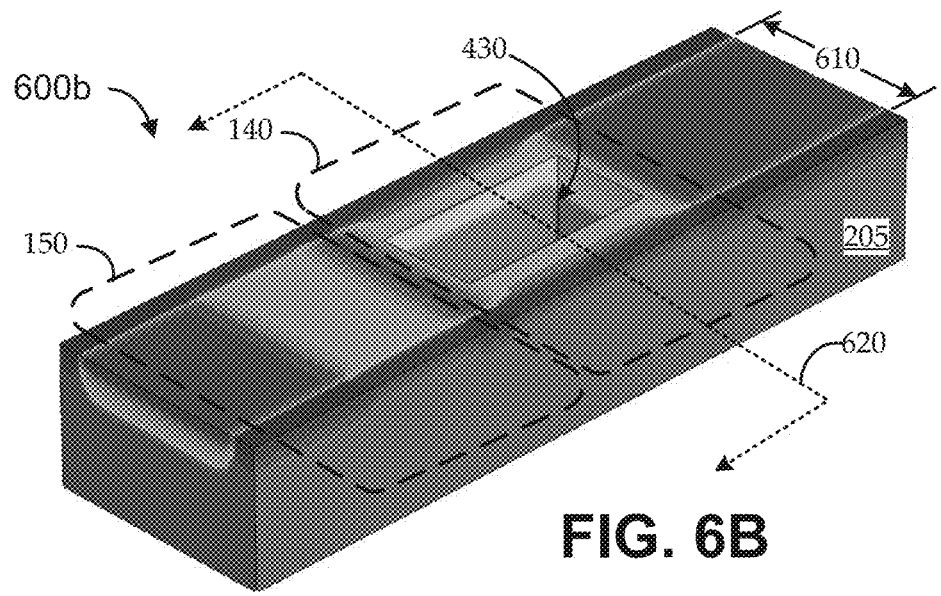
Figure 6C:
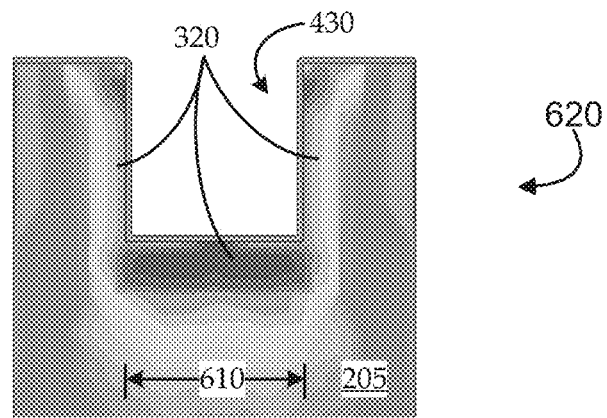

For example, FIGS. 6A-6C show a simulated implementation of the TGSF transistor 300 in a typical installed context on an oxide diffusion region (e.g., of a silicon wafer). FIG. 6A shows an illustrative perspective view of a source-follower block 140 adjacent to a select block 150 on a shared substrate 205, with the source-follower block 140 implemented as a TGSF transistor 300. From the viewpoint of FIG. 6A, the source-follower block 140 could similarly be implemented by a conventional planar-type source-follower transistor. However, FIG. 6B shows the same source-follower block 140 and select block 150 with their respective polygates removed, revealing the trench 430 of the TGSF transistor 300 implementation.

For added clarity, FIG. 6C shows a simulated view corresponding to the cut 620 defined in FIG. 6B. The view shows the trench 430 with the trench-gate 340 removed (as in FIG. 6B) and the implanted regions around the trench 430 forming the buried-trench current channel 320. The simulated view shows that regions closer to the walls of the trench 430 tend to be more heavily doped, and the doping levels tend to decrease with distance from the trench walls. It can be seen that the total effective active width of the current channels formed in the buried-trench current channel 320 around the walls of the trench 430 can be appreciably larger than the physical layout width 610 of the current channel (corresponding to the width of the trench-gate 340).

Figure 7:
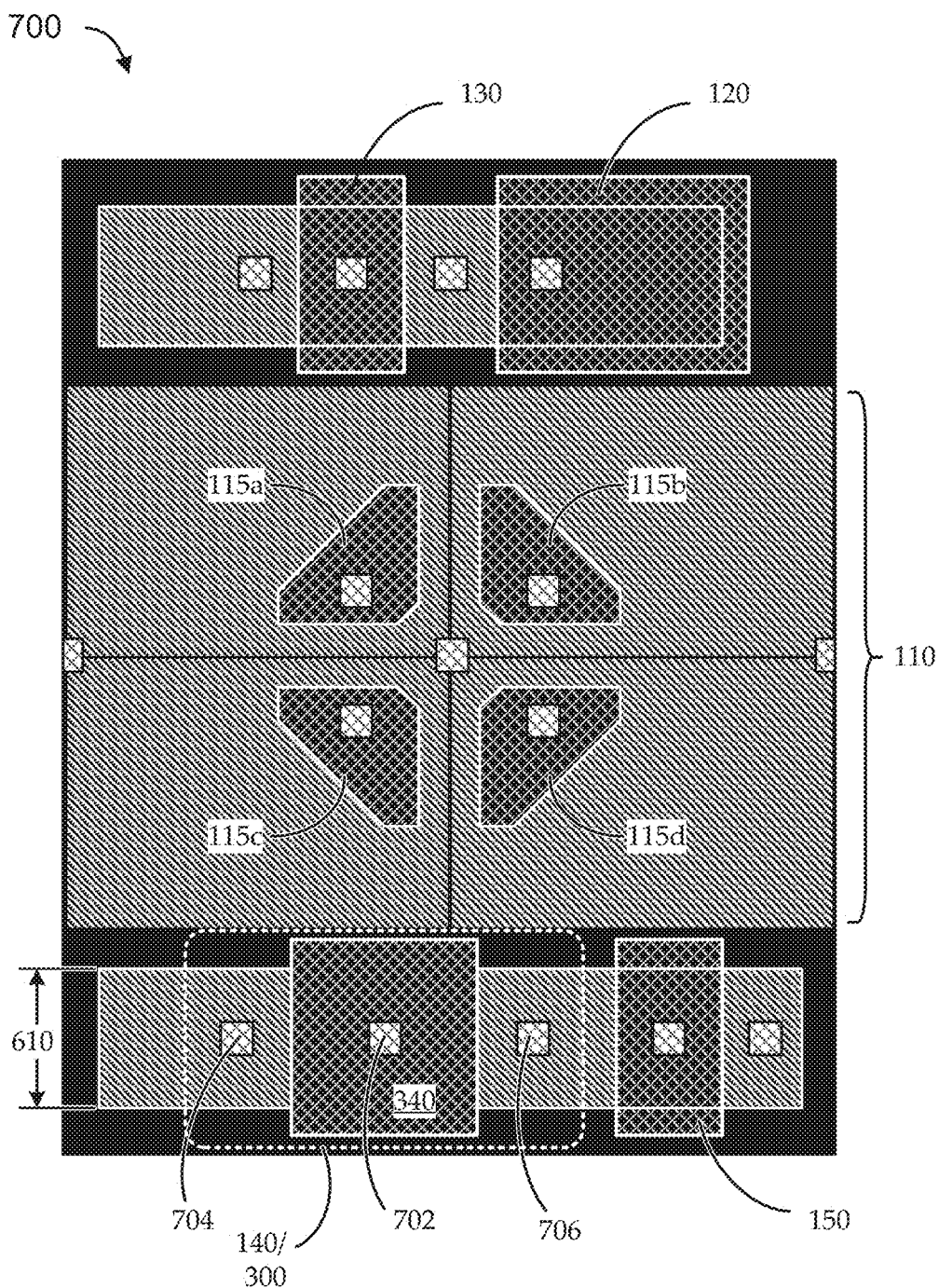
FIG. 7 shows a simplified physical layout of an illustrative CIS pixel having an integrated TGSF transistor, according to various embodiments.

FIG. 7 shows a simplified physical layout of an illustrative CIS pixel 700 having an integrated TGSF transistor 300, according to various embodiments. The illustrative layout can be an implementation of the block diagram of FIG. 1. A center region of the illustrated layout includes a photo-sensor block 110 with four photodiodes 115. An upper portion of the illustrated layout includes a gain block 120 and a reset block 130, with corresponding contacts. A lower portion of the illustrated layout includes a select block 150 and the novel source follower block 140, implemented as TGSF transistor 300 with a trench-gate 340. It can be seen that the width of the various component blocks is established by the design of the layout.

As noted above, at least because of doping parameters and the edge isolation structures, the active region of an active layer of the source follower block 140 has a definable width (W), indicated as the physical layout width 610 of the TGSF transistor 300. In some implementations, the width 610 is determined, at least in part, by pixel design parameters and manufacturing process constraints. For example, as noted above, the pixel footprint design balances allocated space between the photo-sensor block 110 and supporting components, including the source follower block 140 (implemented here by the TGSF transistor 300). The allocated space can typically define the maximum (or nominal) width of transistor components. As illustrated, embodiments of the TGSF transistor 300 can occupy essentially the same layout area as a conventional planar-type source-follower transistor, including occupying a same physical layout width 610. Such implementations allow the TGSF transistor 300 to fit within conventional spacing parameters (e.g., within typical physical design parameters of a standard 2-by-2 CIS pixel layout), including leaving desired area for the photo-sensor block 110, and allowing placing a drain contact 704, source contact 706, and gate contact 702 in locations that can conform to conventional manufacturing processes for the CIS pixel. Other implementations can use other suitable physical layout dimensions in accordance with other CIS photo-sensor block designs, other manufacturing process constraints, etc.

Even in implementations where the physical layout width 610 and the physical layout channel length of the current channel are similar to those of conventional planar source-follower transistors used in conventional CIS photo-sensor blocks, the buried-trench current channel 320 can provide an appreciably larger effective active width for the current channel. For example, the depth of the buried-trench current channel 320 on each side of the trench-gate 340 can effectively be seen as the active width of the current channel on that side of the trench-gate 340, and multiple sides of the trench-gate 340 (e.g., at least the two sides oriented substantially in the z-y plane, according to the convention of FIGS. 3A-3D) effectively form multiple such channels.

As such, forming the buried-trench current channel 320 with a depth of at least the physical layout width 610(W) can yield an effective active current channel width of at least twice the physical layout width 610 from an operational electromagnetic perspective. It can be demonstrated that transconductance (g_m) of source-follower transistors is proportional to a ratio of W to L (i.e., to W divided by L). As such, an effective increase in W with the same L (e.g., 2 W/L) can yield a proportional increase in the transconductance of the transistor (e.g., 2*g_m). For example, a transconductance relationship for a source-follower transistor can be described as follows:

$$g_m^2 = 2C_{ox}\mu_{eff}\frac{W}{Lm}I_D = \left(2\mu_{eff}\frac{\varepsilon_0\varepsilon_{OX}}{m}I_D\right)\left(\frac{W}{L_g g_{OX}}\right).$$

As noted above, g_m is the transconductance, W is the active region width (or effective active current channel width, as in the TGSF transistor 300), L is the current channel length (L_g is the gate length, which corresponds to L), and I_D is the drain current (i.e., essentially the output of the transistor). Other parameters, such as C_ox (oxide capacitance), μ_eff (effective gain), m (body coefficient), and g_ox (oxide thickness) tend to be relatively constant and dependent on the manufacturing process and other such characteristics. It can be seen from this relationship that transconductance has a proportional relationship to the ratio of W to L for the source-follower transistor (i.e., whether the traditional planar source-follower transistor, or the novel TGSF transistor 300). Thus, increasing W relative to L (e.g., nominally doubling W) provides a number of features.

One such feature relates to frame rate. The above relationship demonstrates that gm$^2$ is linearly proportional to the term (W/L_g*g_ox) with constant current. Due at least to such a relationship, transconductance tends to contribute to a maximum frame rate supported by the pixel in the CIS. As such, increasing the W/L ratio by building CIS pixels with TGSF transistor 300 can tend to support higher frame rates of image acquisition. Another such feature relates to power consumption. The above relationship demonstrates that gm$^2$ is linearly proportional to the product of the drain current and the W/L ratio. As such, by increasing the W/L ratio, the same transconductance can be achieved with lower current, and thereby with lower power consumption. For example, if W/L is doubled in the above relationship (i.e., to 2 W/L), the same gm$^2$ can be achieved with half the drain current. The increase in effective active current channel width can yield a number of other features, such as relating to noise performance.

Figure 8:
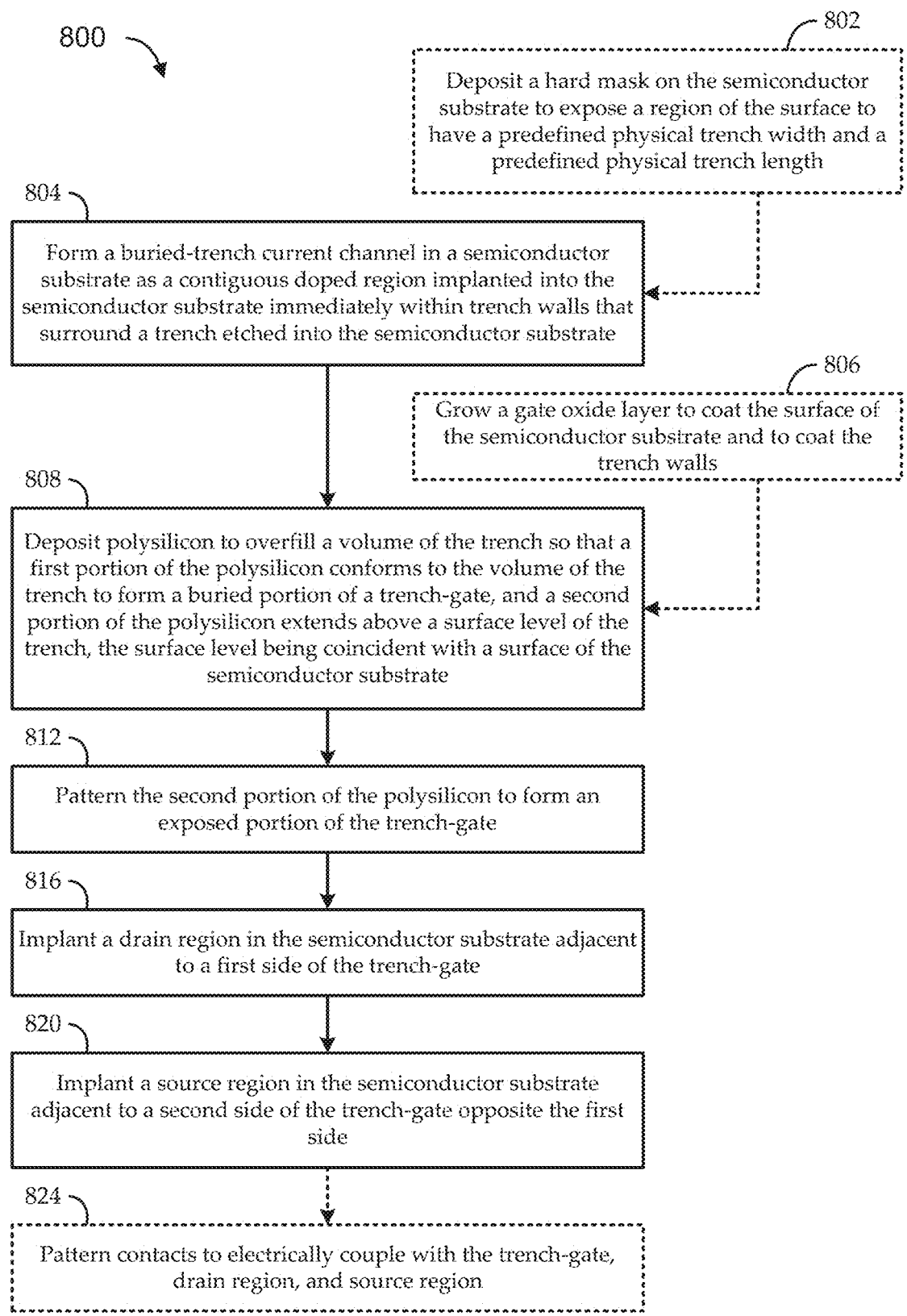
FIG. 8 shows a flow diagram of an illustrative method for manufacturing a TGSF transistor, according to various embodiments described herein.

FIG. 8 shows a flow diagram of an illustrative method 800 for manufacturing a TGSF transistor 300, according to various embodiments described herein. Embodiments of the method 800 begin at stage 804 by forming a buried-trench current channel in a semiconductor substrate. The buried-trench current channel is formed as a contiguous doped region implanted into the semiconductor substrate in trench walls that surround a trench etched into the semiconductor substrate. The phrase "contiguous doped region" is intended to mean that the buried-trench current channel acts electrically as a single doped region that surrounds the trench, even though the implanting of the buried-trench current channel can involve multiple steps of implanting in multiple directions and/or angles.

As described herein, some embodiments use an etch first approach. For example, embodiments can form the buried-trench current channel in stage 804 by: etching the trench into the surface of the semiconductor substrate in accordance with a predefined trench geometry to form the trench walls; and implanting one or more doped regions into the trench walls, subsequent to the etching, to form the contiguous doped region, thereby forming the buried-trench current channel. Other embodiments can use an implant first approach. For example, embodiments can form the buried-trench current channel by: implanting a doped well below the surface of the semiconductor substrate to occupy a volume subsuming both the volume of the trench and the contiguous doped channel region; and etching the trench into the surface of the semiconductor substrate and into the doped well, so that the trench walls formed around the trench define a portion of the doped well as the contiguous doped channel region implanted in the trench walls, thereby forming the buried-trench current channel.

Some embodiments begin at stage 802 by depositing a hard mask on the semiconductor substrate. The hard mask exposes a region of the surface to have a predefined physical trench width and a predefined physical trench length. In such embodiments, the trench is etched into the semiconductor substrate (e.g., before or after implanting of the contiguous doped region) via the hard mask so that the trench walls and the surface level accord substantially with the predefined physical trench width, the predefined physical trench length, and a predefined physical trench depth.

At stage 808, embodiments can deposit polysilicon to overfill a volume of the trench so that a first portion of the polysilicon conforms to the volume of the trench to form a buried portion of a trench-gate, and a second portion of the polysilicon extends above a surface level of the trench, the surface level being coincident with a surface of the semiconductor substrate. At stage 812, embodiments can pattern the second portion of the polysilicon to form an exposed portion of the trench-gate. Some embodiments include growing a gate oxide layer, at sage 806, prior to the depositing the polysilicon at stage 808, to coat the surface of the semiconductor substrate and to coat the trench walls. In such embodiments, the volume of the trench as overfilled by the polysilicon in stage 808 is a coated volume accounting for a thickness of the gate oxide layer coating the trench walls.

In some embodiments, the second portion of the polysilicon extends above the surface level of the trench by an amount exceeding a predefined gate height. For example, a polysilicon layer is deposited over the surface (e.g., or a region of the surface) of the semiconductor substrate, including into the trench. Because the bottom surface of the trench is lower than the surrounding surface of the semiconductor substrate, the upper surface of the polysilicon layer just over the trench can naturally be lower than in surrounding areas (e.g., lower by an amount corresponding to the depth of the trench. To ensure that the height of the polysilicon layer just over the trench is at least at the predefined gate height (with respect to the surface level of the trench, which is also the level of the surrounding surface of the semiconductor substrate), the polysilicon layer may have to be deposited to a thickness of at least the trench depth plus the predefined gate height. An illustration of this can be seen in FIG. 4G. In some such embodiments, patterning the second portion at stage 812 includes polishing the second portion of the polysilicon to form a top surface of the trench-gate substantially at the predefined gate height above the surface level of the trench. An illustration of this can be seen in FIG. 4H. In some such embodiments, patterning the second portion at stage 812 further includes depositing a gate mask on the top surface to mask out a region corresponding to a layout width and a layout length of the trench-gate, and etching the second portion of the polysilicon around the gate mask to pattern the exposed portion of the trench-gate. An illustration of this can be seen in FIGS. 4I and 4J. In some embodiments, the trench is etched to have a trench length and a trench width, and the patterning at stage 812 forms the exposed portion of the trench-gate to have a gate layout length that coincides with the trench length and a gate layout width that exceeds the trench width. An illustration of this can be seen in FIG. 4J.

At stage 816, embodiments can implant a drain region in the semiconductor substrate adjacent to a first side of the trench-gate. At stage 820, embodiments can implant a source region in the semiconductor substrate adjacent to a second side of the trench-gate opposite the first side. In some embodiments, implanting the drain region includes implanting a first lighter-doped region to electrically couple with a portion of the buried-trench current channel at the first side of the trench-gate, and implanting a first higher-doped region within the first lighter-doped region. In some embodiments, implanting the source region includes implanting a second lighter-doped region to electrically couple with a portion of the buried-trench current channel at the second side of the trench-gate, and implanting a second higher-doped region within the second lighter-doped region.

In some embodiments, at stage 824, the method 800 can include patterning a gate contact to electrically couple with the trench-gate, a drain contact to electrically couple with the drain region, and a source contact to electrically couple with the source region. As described herein, electrically activating the gate contact can activate the buried-trench current channel to provide current flow between the drain contact and the source contact around the buried portion of the trench-gate. For example, when the channel is active, current flows primarily around the two length-wise sides of the buried portion of the trench-gate. The multiple parallel current paths around the trench-gate and the depth dimension of the trench can increase the effective active width of the current channel.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third." etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A method for manufacturing a trench-gate source-follower (TGSF) transistor block, the method comprising:
   forming a buried-trench current channel in a semiconductor substrate, such that the buried-trench current channel is a contiguous doped region implanted into the semiconductor substrate in trench walls that surround a trench etched into the semiconductor substrate,
   wherein the forming comprises implanting a doped well below the surface of the semiconductor substrate to occupy a volume subsuming both the volume of the trench and the contiguous doped channel region, and etching the trench into the surface of the semiconductor substrate and into the doped well, so that the trench walls formed around the trench define a portion of the doped well as the contiguous doped channel region implanted in the trench walls, thereby forming the buried-trench current channel;
   depositing polysilicon to overfill a volume of the trench so that a first portion of the polysilicon conforms to the volume of the trench to form a buried portion of a trench-gate, and a second portion of the polysilicon extends above a surface level of the trench, the surface level being coincident with a surface of the semiconductor substrate;
   patterning the second portion of the polysilicon to form an exposed portion of the trench-gate;
   implanting a drain region in the semiconductor substrate adjacent to a first side of the trench-gate; and
   implanting a source region in the semiconductor substrate adjacent to a second side of the trench-gate opposite the first side.

2. The method of claim 1, further comprising:
   patterning a gate contact to electrically couple with the trench-gate, a drain contact to electrically couple with the drain region, and a source contact to electrically couple with the source region, such that electrically activating the gate contact activates the buried-trench current channel to provide current flow between the drain contact and the source contact around the buried portion of the trench-gate.

3. The method of claim 1, further comprising:
   depositing a hard mask on the semiconductor substrate, the hard mask exposing a region of the surface to have a predefined physical trench width and a predefined physical trench length,
   wherein the trench is etched into the semiconductor substrate via the hard mask so that the trench walls and the surface level accord substantially with the predefined physical trench width, the predefined physical trench length, and a predefined physical trench depth.

4. The method of claim 1, further comprising:
   growing a gate oxide layer, prior to the depositing the polysilicon, to coat the surface of the semiconductor substrate and to coat the trench walls, such that the volume of the trench as overfilled by the polysilicon is a coated volume accounting for a thickness of the gate oxide layer coating the trench walls.

5. The method of claim 1, wherein:
   the second portion of the polysilicon extends above the surface level of the trench by an amount exceeding a predefined gate height; and
   the patterning the second portion comprises polishing the second portion of the polysilicon to form a top surface of the trench-gate substantially at the predefined gate height above the surface level of the trench.

6. The method of claim 5, wherein the patterning the second portion further comprises:
   depositing a gate mask on the top surface to mask out a region corresponding to a layout width and a layout length of the trench-gate; and
   etching the second portion of the polysilicon around the gate mask to pattern the exposed portion of the trench-gate.

7. The method of claim 1, wherein:
   the trench is etched to have a trench length and a trench width; and
   the patterning the second portion of the polysilicon forms the exposed portion of the trench-gate to have a gate layout length that coincides with the trench length and a gate layout width that exceeds the trench width.

8. The method of claim 1, wherein:
- implanting the drain region comprises implanting a first lighter-doped region to electrically couple with a portion of the buried-trench current channel at the first side of the trench-gate, and implanting a first higher-doped region within the first lighter-doped region; and
- implanting the source region comprises implanting a second lighter-doped region to electrically couple with a portion of the buried-trench current channel at the second side of the trench-gate, and implanting a second higher-doped region within the second lighter-doped region.

9. A trench-gate source-follower (TGSF) transistor block comprising:
- a buried-trench current channel formed in a semiconductor substrate as a contiguous doped region implanted into the semiconductor substrate in trench walls that surround a trench etched into the semiconductor substrate,
- wherein the buried-trench current channel is formed by implanting a doped well below the surface of the semiconductor substrate to occupy a volume subsuming both the volume of the trench and the contiguous doped channel region, and etching the trench into the surface of the semiconductor substrate and into the doped well, so that the trench walls formed around the trench define a portion of the doped well as the contiguous doped channel region implanted in the trench walls, thereby forming the buried-trench current channel;
- a trench-gate formed by depositing polysilicon to overfill a volume of the trench so that the trench-gate comprises:
  - a buried portion formed by a first portion of the polysilicon filling and conforming to the volume of the trench; and
  - an exposed portion formed by patterning a second portion of the polysilicon that extends above a surface level of the trench, the surface level being coincident with a surface of the semiconductor substrate;
- a drain region implanted in the semiconductor substrate adjacent to a first side of the trench-gate; and
- a source region implanted in the semiconductor substrate adjacent to a second side of the trench-gate opposite the first side.

10. The TGSF transistor block of claim 9, further comprising:
- a gate contact patterned on the semiconductor substrate to electrically couple with the trench-gate;
- a drain contact patterned on the semiconductor substrate to electrically couple with the drain region; and
- a source contact patterned on the semiconductor substrate to electrically couple with the source region,
- such that electrically activating the gate contact activates the buried-trench current channel to provide current flow between the drain contact and the source contact around the buried portion of the trench-gate.

11. The TGSF transistor block of claim 9, further comprising: a gate oxide layer formed to coat at least the trench walls, such that the buried portion of the trench-gate is physically separated from the buried-trench current channel by the gate oxide layer,
- wherein the volume of the trench as overfilled by the polysilicon is a coated volume accounting for a thickness of the gate oxide layer coating the trench walls.

12. The TGSF transistor block of claim 9, wherein:
- the second portion of the polysilicon extends above the surface level of the trench by an amount exceeding a predefined gate height; and
- the exposed portion is formed at least by polishing the second portion of the polysilicon to form a top surface of the trench-gate substantially at the predefined gate height above the surface level of the trench.

13. The TGSF transistor block of claim 9, wherein:
- the trench is etched to have a trench length and a trench width; and
- the exposed portion is formed by the patterning the second portion of the polysilicon to have a gate layout length that coincides with the trench length and a gate layout width that exceeds the trench width.

14. The TGSF transistor block of claim 9, wherein:
- the drain region is implanted to comprise a first lighter-doped region implanted to electrically couple with a portion of the buried-trench current channel at the first side of the trench-gate, and a first higher-doped region implanted within the first lighter-doped region; and
- the source region is implanted to comprise a second lighter-doped region implanted to electrically couple with a portion of the buried-trench current channel at the second side of the trench-gate, and a second higher-doped region implanted within the second lighter-doped region.

15. A complementary metal-oxide semiconductor (CMOS) image sensor (CIS) pixel physical architecture comprising:
- a semiconductor substrate;
- a pixel block having a set of photodiodes integrated with the semiconductor substrate; and
- an oxide diffusion region integrated with the semiconductor substrate adjacent to the set of photodiodes and having at least a trench-gate source-follower (TGSF) transistor block disposed thereon, the TGSF transistor block comprising:
  - a buried-trench current channel formed in the oxide diffusion region as a contiguous doped region implanted into the semiconductor substrate in trench walls that surround a trench etched into the semiconductor substrate,
  - wherein the buried-trench current channel is formed by implanting a doped well below the surface of the semiconductor substrate to occupy a volume subsuming both the volume of the trench and the contiguous doped channel region, and etching the trench into the surface of the semiconductor substrate and into the doped well, so that the trench walls formed around the trench define a portion of the doped well as the contiguous doped channel region implanted in the trench walls, thereby forming the buried-trench current channel;
  - a trench-gate formed by depositing polysilicon to overfill a volume of the trench so that the trench-gate comprises:
    - a buried portion formed by a first portion of the polysilicon filling and conforming to the volume of the trench; and
    - an exposed portion formed by patterning a second portion of the polysilicon that extends above a surface level of the trench, the surface level being coincident with a surface of the semiconductor substrate;
  - a drain region implanted in the oxide diffusion region adjacent to a first side of the trench-gate; and a source region implanted in the oxide diffusion region adjacent to a second side of the trench-gate opposite the first side.

16. The CIS pixel physical architecture of claim 15, wherein the TGSF transistor block further comprises:
a gate contact patterned on the semiconductor substrate to electrically couple with the trench-gate;
a drain contact patterned on the semiconductor substrate to electrically couple with the drain region; and
a source contact patterned on the semiconductor substrate to electrically couple with the source region,
such that electrically activating the gate contact activates the buried-trench current channel to provide current flow between the drain contact and the source contact around the buried portion of the trench-gate.

* * * * *